(12) United States Patent
Ray-Chaudhuri et al.

(10) Patent No.: US 6,206,528 B1
(45) Date of Patent: *Mar. 27, 2001

(54) SURFACE FIGURE CONTROL FOR COATED OPTICS

(75) Inventors: Avijit K. Ray-Chaudhuri, Livermore; Paul A. Spence, Pleasanton; Michael P. Kanouff, Livermore, all of CA (US)

(73) Assignee: EUV LLC, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/164,413

(22) Filed: Sep. 30, 1998

(51) Int. Cl.$^7$ .................................................. G02B 7/182
(52) U.S. Cl. ......................... 359/871; 359/838; 359/846; 359/848
(58) Field of Search .................................. 359/224, 838, 359/846, 848, 871, 872

(56) References Cited

U.S. PATENT DOCUMENTS

| | | | |
|---|---|---|---|
| 4,655,543 | * 4/1987 | Montagu | 350/6.6 |
| 5,035,495 | 7/1991 | Toyoda et al. | 350/588 |
| 5,089,915 | * 2/1992 | Gobeli | 359/846 |
| 5,276,545 | * 1/1994 | Daun et al. | 359/198 |
| 5,357,825 | * 10/1994 | Costello et al. | 359/846 |
| 5,699,181 | * 12/1997 | Choi | 359/224 |
| 5,748,435 | 5/1998 | Parkhe | 361/234 |
| 5,917,644 | * 6/1999 | LaFiandra | 359/224 |

FOREIGN PATENT DOCUMENTS

0714998A2   5/1996   (EP) ............................... C23C/16/44

* cited by examiner

Primary Examiner—Cassandra Spyrou
Assistant Examiner—Craig Curtis
(74) Attorney, Agent, or Firm—L. E. Carnahan

(57) ABSTRACT

A pedestal optical substrate that simultaneously provides high substrate dynamic stiffness, provides low surface figure sensitivity to mechanical mounting hardware inputs, and constrains surface figure changes caused by optical coatings to be primarily spherical in nature. The pedestal optical substrate includes a disk-like optic or substrate section having a top surface that is coated, a disk-like base section that provides location at which the substrate can be mounted, and a connecting cylindrical section between the base and optics or substrate sections. The optic section has an optical section thickness$^2$/optical section diameter ratio of between about 5 to 10 mm, and a thickness variation between front and back surfaces of less than about 10%. The connecting cylindrical section may be attached via three spaced legs or members. However, the pedestal optical substrate can be manufactured from a solid piece of material to form a monolith, thus avoiding joints between the sections, or the disk-like base can be formed separately and connected to the connecting section. By way of example, the pedestal optical substrate may be utilized in the fabrication of optics for an extreme ultraviolet (EUV) lithography imaging system, or in any optical system requiring coated optics and substrates with reduced sensitivity to mechanical mounts.

15 Claims, 3 Drawing Sheets

SURFACE FIGURE CONTROL FOR COATED OPTICS

The United States Government has rights in this invention pursuant to a Contract between the United States Department of Energy and the Sandia National Laboratories.

BACKGROUND OF THE INVENTION

The present invention relates to optical substrates, particularly to optical substrates that contain coated reflective optics, and more particularly to a pedestal type optical substrate that maintains acceptable figure before or after coating, is not sensitive to mount disturbance loads, and demonstrates high dynamic stiffness.

Optics for extreme ultraviolet (EUV) lithography imaging systems, for example, require coated reflective optics that are precisely figured at the angstrom level. In such reflective optics, the optical substrates are first figured, then coated with a film of material that is reflective in the ultraviolet wavelengths. Unfortunately, the coated film has a residual stress that causes the substrate to deform from its desired figure. It has been shown that in order to reduce stress-induced non-spherical deformation on the figured optical substrate it is necessary to 1) maintain thickness uniformity of the optical substrate; 2) maximize "freeboard", i.e., that portion of an optical surface between the clear aperture and the edge of the optical substrate; and 3) minimize the thickness of the optical substrate. Reducing substrate thickness reduces non-spherical deformation near the edge of the substrate and is particularly important when freeboard is minimal. It must be noted that substrate thickness cannot be reduced without bound. Extremely thin substrates are susceptible to non-spherical deformation induced by spatial variations in the magnitude of the film stress. Thus, for a disk-like optical substrate, the non-spherical component of the figure distortion decreases as the aspect ratio (width divided by height) of the substrate increases. Thus, while thinner substrates deform more due to the coating, the deformation is primarily spherical. In many cases an imaging system is relatively insensitive to spherical changes in an individual optic. Thus, a thinner substrate reduces the negative effect of coating residual stress.

The coated optics must be assembled into the imaging system using some form of mechanical attachment. The mechanical attachment, referred to as the optical mount, is physically attached to the substrate. This attachment is a mechanism through which undesired figure distorting forces and moment are applied to the substrate. There are many sources of these disturbance inputs, including system temperature changes, distortion of their imaging system structure, and residual stress due to the mounting process. The sensitivity of the optics surface figure is directly related to the mechanical stiffness of the substrate. An infinitely stiff substrate would not deform due to these inputs. A realistic, disk-like substrate will always demonstrate a level of sensitivity to these mount induced disturbance loads. The lower the aspect ratio of a disk-like substrate, the lower the optic's sensitivity to disturbance loads. Thus, a thicker substrate reduces the sensitivity of a substrate to disturbance loads.

Frequently, there is a requirement that an optical substrate demonstrates a high degree of dynamic stiffness. A low aspect ratio substrate generally provides for more favorable (higher) dynamic stiffness.

The problem is that while a thinner substrate reduces negative coating effects, it may not provide the necessary stiffness and insensitivity to mount disturbances. The present invention, which involves a pedestal substrate, addresses the need to have an optical substrate that maintains acceptable figure before or after coating, is not sensitive to mount disturbance loads, and demonstrates high dynamic stiffness. The pedestal substrate of the present invention comprises the basic components: 1) a disk-like optic or substrate section, the top surface of which is to be coated with reflective material, 2) a disk-like base section, and 3) a connecting section between the base and optic or substrate sections. These three sections may be formed as a monolith from a solid piece of material, the optic or substrate section and the connecting section may be formed from a solid piece, or the three sections formed individually and secured together. The pedestal substrate approach of the present invention permits the optic component designer to independently control the effects of residue coating film stress, mount disturbance loads, and substrate dynamic stiffness.

One aspect of the present invention is to overcome the problem of mounting torque created by the thinner optical substrate or section, shown to be particularly desirable by the design rules set forth herein. The optical substrate can include a coated optic section or mirror; the terms "optic section" and "mirror" as used here are synonymous. Thus, a second aspect of the present invention is to substantiate the quantitative design rules that have been established for reducing highly non-spherical deformation that arises in the coated optic section, which cannot be corrected for, due to stresses induced by the multilayer reflective film coating. These design rules, which establish and quantify the relationship between the thickness of the optic section and its diameter and freeboard, show that it is particularly desirable to maximize the freeboard surrounding the clear aperture because the majority on non-spherical deformation occurs near the edge of the optic section. It should be noted here that stopping the multilayer reflective coating short (i.e., several millimeters) of the edge of the optic section results in only a small reduction in the edge deformation. As discussed above, minimizing the aspect ratio (ratio of height, or thickness, to width, or diameter) of the optic section is also desirable because this enhances spherical deformation, which can be corrected for, at the expense of non-spherical deformation, which cannot. Moreover, it is also desirable to minimize thickness variation across the optic section (between front and back surfaces) since thickness variation also results in non-correctable non-spherical deformation.

SUMMARY OF THE INVENTION

It is an object of the present invention to provide an improved substrate for both coated and uncoated optics.

A further object of the invention is to provide a pedestal substrate for coated optics.

A further object of the invention is to provide a pedestal substrate for coated optics comprising a substrate section, a base section, and a connector section.

Another object of the invention is to provide a pedestal optical substrate that simultaneously provides high substrate dynamic stiffness, low surface figure sensitivity to mechanical mounting hardware inputs, and constrains surface figure changes caused by optical coatings to assume a desired form, for example, spherical.

Another object of the invention is to provide a pedestal substrate which includes a disk-like optic section, a disk-like base section, and a connecting section between the base and optic sections.

Another object of the invention is to substantiate quantitative design rules for coated optics sections, and particularly coated optics sections or mirrors useful for extreme ultraviolet lithography (EUVL), that reduce the magnitude of non-spherical deformation caused by stress induced by the multilayer film coatings.

Another object of the invention is to provide a pedestal substrate having an optic section with an aspect ratio, given by the relationship (optic section thickness$^2$/optic section diameter), of between about 5 to 10 mm.

Another object of the invention is to provide a pedestal substrate having a freeboard (that portion of an optical surface between the clear aperture and the edge of the optical substrate) whose width is at least equal to that given by the relationship ⅓x (optic section thickness$^2$/optic section diameter).

Another object of the invention is to provide a pedestal substrate having an optical section with a thickness variation of less than 10%.

Other objects and advantages of the present invention will become apparent from the following description and accompanying drawings. The present invention involves a pedestal substrate for coated optics. The pedestal substrate of this invention provides an optical substrate that maintains acceptable figure after coating, is not sensitive to mount disturbance loads, and has high dynamic stiffness. Thus, the present invention provides an optical component for extreme ultraviolet (EUV) lithography imagine systems or any optical system requiring coated optics and/or substrates with reduced sensitivity to mechanical mounts. The invention involves a pedestal substrate composed of three basic elements: 1) a disk-like optic section having a top surface that requires coating, 2) a disk-like base section, and 3) a connecting section between the base and optic sections. The optic section should have a thickness variation of less than about 10%, an optic section thickness$^2$/optic section diameter of about 5 to 10 mm, and a freeboard width of at least equal to that given by the relationship ⅓x (optic section thickness$^2$/optic section diameter. The connecting section may be a separate component secured to both the optic section and the base section, may be integral with the optic section, or may be integral with the optic and base sections. The connecting section, if separate from the base section, may be secured to the base section, at three equally spaced locations, and if separate from the optic section, may be secured thereto at three or more points or may be continuously secured. The connecting section may be triangular, but preferably cylindrical, and may be hollow. The connecting section may be secured to the optic section, but preferably the connecting section is integral with the optics section, and may be solid or hollow. The three basic components of the pedestal substrate of the invention are preferably fabricated from a low thermal expansion glass or from low thermal expansion ceramics such as Zerodur, ULE, or Zerodur M.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF TIE INVENTION

Figure 1:
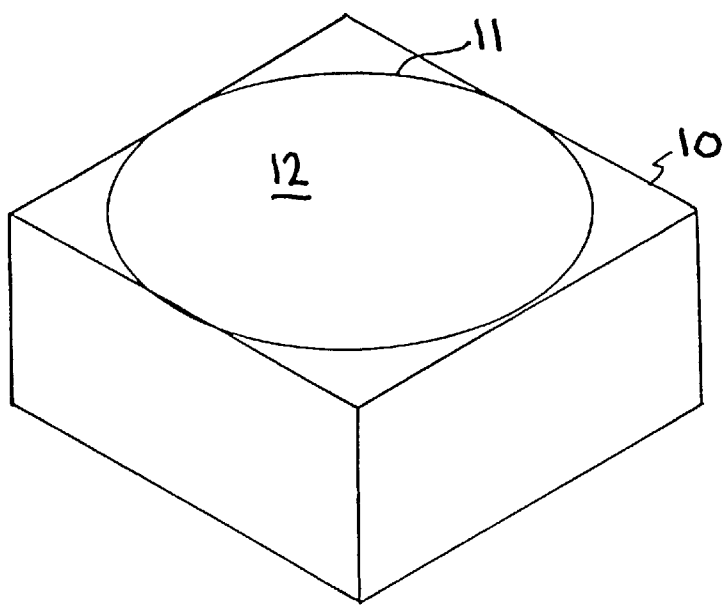
FIGS. 1–5 illustrate the fabrication of an embodiment of a pedestal substrate made in accordance with the present invention.

The present invention is directed to a pedestal substrate for coated or uncoated optics. The pedestal optical substrate simultaneously provides high substrate dynamic stiffness, low surface figure sensitivity to mechanical mounting hardware inputs, and provides control over the surface figure changes caused by optical coatings, for example, making them to be primarily spherical in nature. The pedestal substrate of this invention has the following five distinctive features:

1. A disk-like optic or substrate section that is figured to the optical prescription, with the top surface of this section being the optical surface and the surface that requires coating.

2. A disk-like base section that provides locations at which the substrate can be mounted.

3. A connecting section between the base and optic or substrate sections.

4. The connecting section attaches to at least the base section through three distinct members or legs.

5. Sections of the pedestal substrate can be a monolith formed from a solid piece of material avoiding joints and the dimensional uncertainty that comes with jointed structures.

It has been found that in order to minimize the stress-induced non-spherical deformation on the optic section it is desirable to maximize freeboard and minimize the aspect or thickness$^2$/diameter ratio. By way of example, to achieve an RMS non-spherical deformation of 1 Å or less within a clear aperture for a film stress of about 350 MPa on an optic section or mirror having a diameter between about 50 and 350 mm and 3 mm freeboard, the optic section should be designed with an aspect ratio such that the ratio (optic section thickness$^2$/optic section diameter) is between about 5 to 10 mm. Moreover, as the aspect ratio increases so should the freeboard. For optic sections having a diameter between 50 and 350 mm it is preferred to have a freeboard which is at least one-third of the aspect ratio, i.e., ⅓x (optic section thickness$^2$/optic section diameter).

In order to reduce non-spherical deformation of the optic section or mirror it is particularly desirable that thickness variations across the optic section be minimized, i.e., the back side of the optic section should be parallel with the front side. If the radius of curvature of the front surface of the optic section is such that a flat back side would cause thickness variation of >10%, then the back surface should also be curved such that the back side is parallel the front side and thus, the thickness of the optic section is constant.

The optic section of the pedestal substrate can be designed such that its aspect ratio and/or cross section is as required to constrain coating residual stress deformation as desired. For example, this section can have a constant cross section with an optic section thickness$^2$/optic section diameter ratio of about 5 to 10 mm so that the coating causes primarily spherical deformation. The cross section may be non uniform to cause other desirable figure changes.

The intersection of the connecting section with the optic section can be designed to influence the residual stress deformation of the optic section as desired. For example, using a hollow, right circular cylinder as a connecting section to a thin (10 to 20 mm) optic section results in primarily spherical deformation due to a constant valued residual stress. Variations of the connecting section attachment to the optic section can be made to influence the residual film stress caused deformations in other ways or to control effect related to varying residual stress.

The present invention can, for example, be incorporated into the pedestal type optical substrate described and illustrated in copending U.S. application Ser. No. 09/164,414, filed Sep. 30, 1998, entitled "Pedestal Substrate For Coated Optics", by L. C. Hale, T. N. Malsbury and S. R. Patterson, wherein the connecting section preferably attaches to the base section through three legs equally spaced in angle about the optic section axis. The drawings, described hereinafter, and which are the same as in above-referenced Ser. No. 09/164,414, set forth acceptable approaches to attaching the connecting section and the base section. A similar multi-leg or continuous attachment may be used to attach the connecting section to the optic section, if these two sections are not formed integral. The use of three symmetric legs reduce deformation of the optical surface due to deformations of the base section. This form of attachment tries to force deformations of the base section to cause primarily rigid body type motions of the optical surface. This reduces the sensitivity of the optical figure to disturbance loads at the mounting locations. The connecting section may be solid, though preferably hollow, and it may be of a triangular configuration with a three leg attachment approach.

The base section can be designed such that its aspect ratio is required to control the sensitivity of the optical surface to disturbance loads input at the mounting locations. For example, the base section can be made thick (20 to 30 mm) to improve (reduce) the deformations due to disturbance loads, but the sizes could be changed depending on the application.

It is thus seen that the role of the base section is to transfer disturbance loads to the other mounting locations with minimal distortion of the base section. The connecting section isolates the optical surface from the base section distortions that do occur. The optic or substrate section can be figured as specified and can be designed to deform in a prescribed manner due to coating film residual stress. The pedestal substrate of this invention, thus permits the designer to independently control the effects of residual coating film stress, mount disturbance loads and substrate dynamic stiffness.

Figure 2:
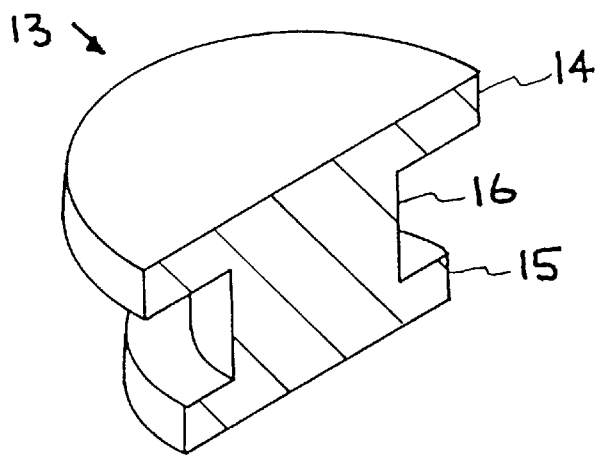
Figure 4:
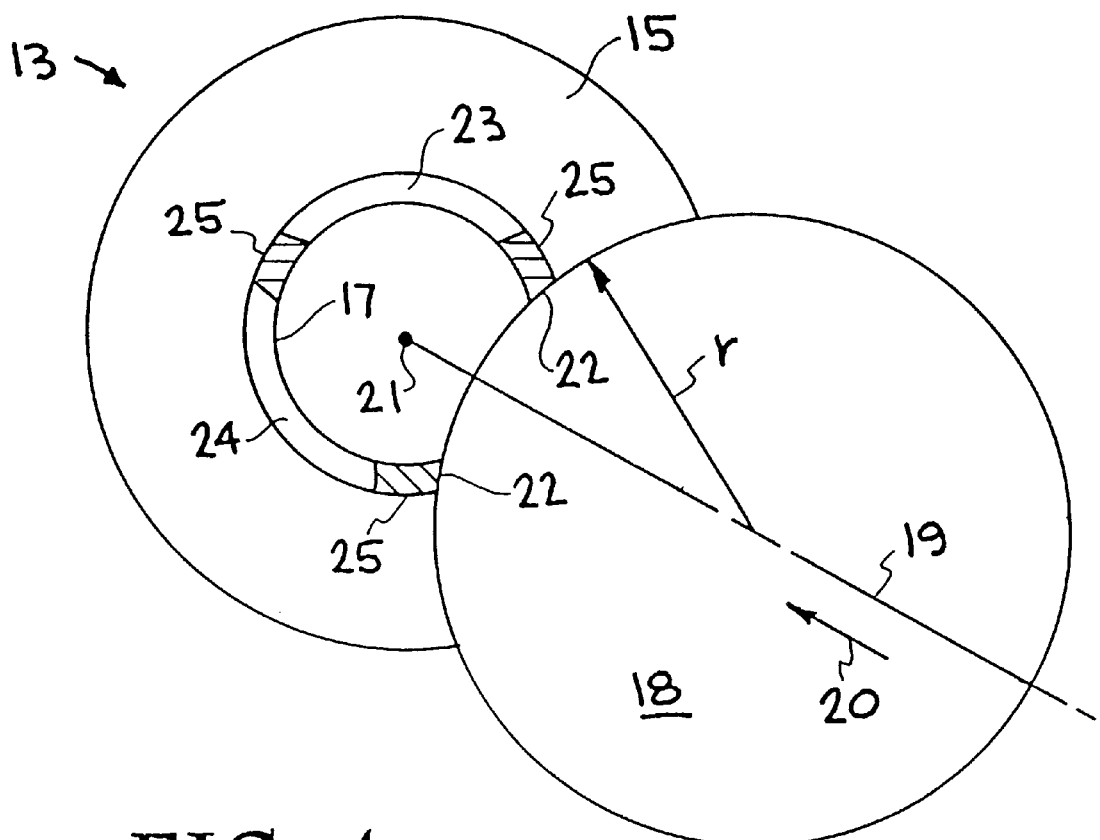
Figure 5:
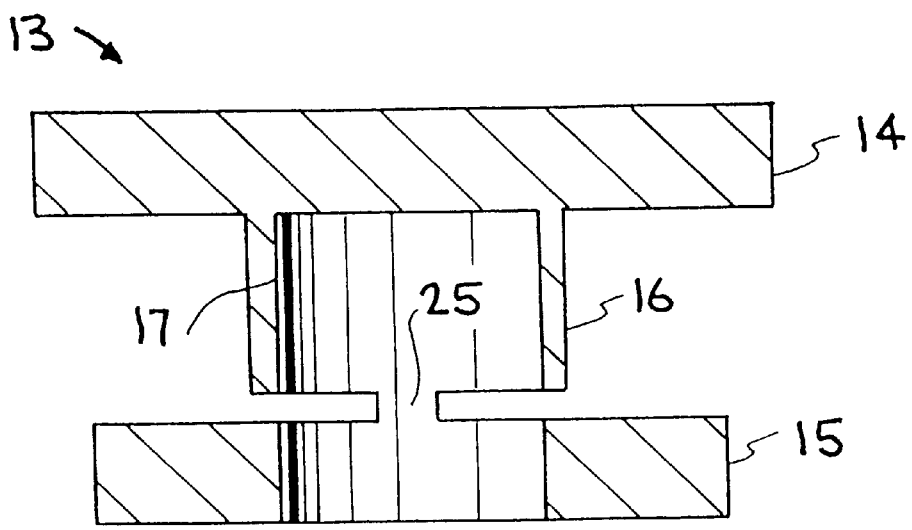
Figure 6:
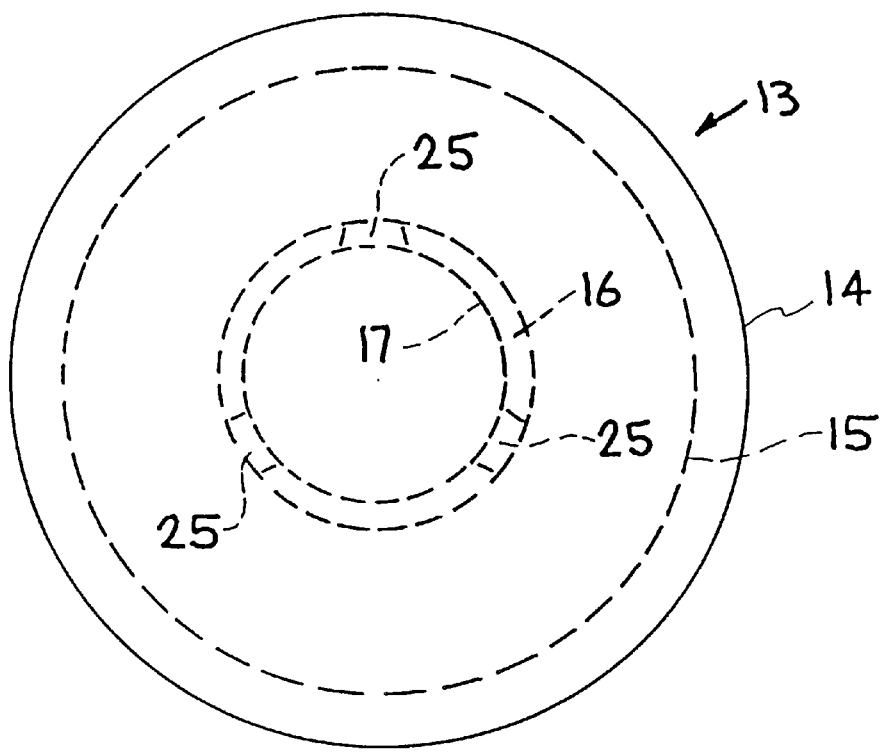
FIG. 6 is a top view of the finished pedestal embodiment fabricated as shown in FIGS. 1–5.
Figure 7:
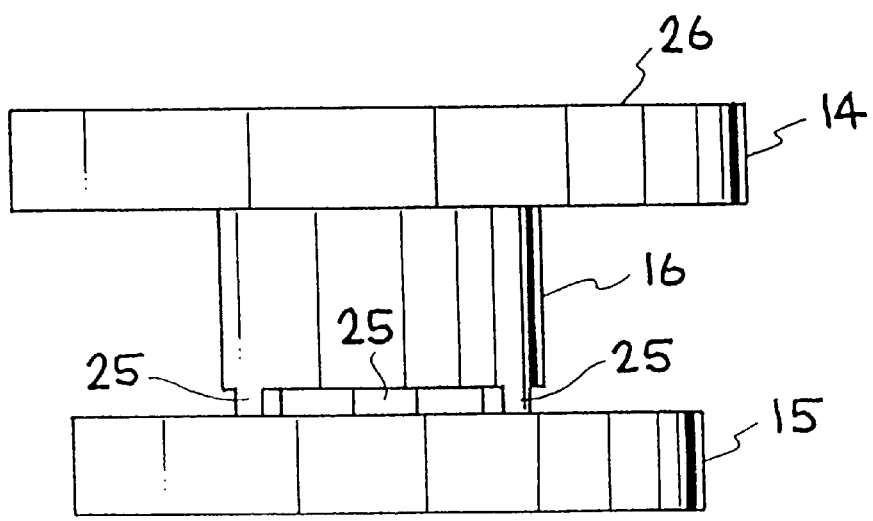
FIG. 7 is an elevation view of the finished pedestal of FIG. 6.

Referring now to the drawings, FIGS. 1–5 illustrate the formation or fabrication of an embodiment of a pedestal substrate from a single piece of material, with the finished pedestal being illustrated in FIGS. 6 and 7. As shown in FIG. 1, block 10 of material is scribed as indicated at 11 with a circular configuration 12 illustrating the optic section of the pedestal substrate to be formed. By known process the material of block 10 is removed to produce a spool shaped member or pedestal 13, as shown in FIG. 2, which consists of an upper flange shape which defines an optic section 14 of the pedestal 13, a lower flange shape which defines a base section 15 of pedestal 13, with the flanges being interconnected by material which defines a connecting section 16 of the pedestal 13. As set forth above, it is desirable to maximize freeboard, maintain the optic section thickness$^2$/optic section diameter ratio of the optic section 14 between about 5 to 10 mm, and to minimize the thickness variations thereacross (front side to back side) to less than 10%. Note that as shown in FIG. 2, base section 15 is of a smaller diameter than optic section 14, but this is not required. Each section can be independently sized to extract maximum benefit.

Figure 3:
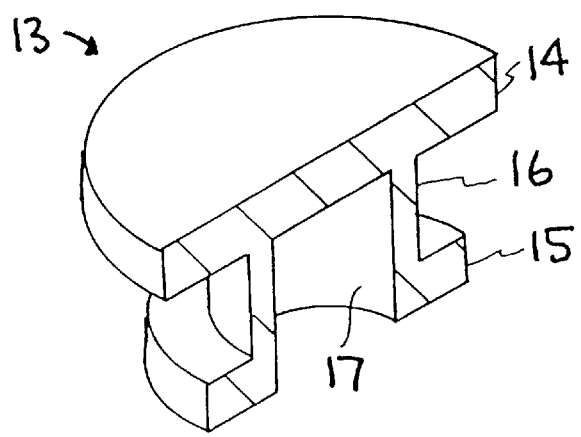

The pedestal 13 of FIG. 2 is further processed as shown in FIG. 3, wherein removal of material from the connecting section 16 and base section 15 produce a hollowed out surface 17 in connecting section 16 and an opening in base section 15.

FIG. 4 is a horizontal cross section taken near where the hollow connecting section 16 joins the base section 15. A cutting tool 18 of radius r, moves along a line indicated at 19 in the direction of arrow 20 towards an axis 21 of pedestal 13 removing material from the connecting section 16 to form a cutaway in connecting section 16 as indicated at 22. The cutting tool 18 is then moved about pedestal 13 and similar cut-aways 23 and 24 are formed, to produce three radial, symmetrically spaced segments or legs 25 adjacent the intersection of the connecting section 16 with the base section 15, as shown in FIG. 5 which illustrates a vertical cross section of pedestal 13 showing one of the three segments or legs 25.

FIG. 6 illustrates a top view of finished pedestal substrate 13, while FIG. 7 illustrates an elevation view of the pedestal substrate 13 having an optical surface 26 on which material is deposited to produce a reflective surface.

While not shown, the base section can be made integral with the connecting section, and the connecting section provided with three (3) legs for securing same to the optic section, or the three sections may be fabricated separately and interconnected by a three leg arrangement.

It has thus been shown that the present invention provides a pedestal substrate for coated optics that simultaneously provides high substrate dynamic stiffness, low surface figure sensitivity to mechanical mounting hardware inputs, and constrains surface figure changes caused by optical coatings to be primarily spherical in nature. The optics section of the pedestal substrate maximizes freeboard, minimizes the aspect ratio, and minimizes the thickness variations to less than 10%. The pedestal substrate of the invention may be utilized in any optical system requiring coated optics and substrates with reduced sensitivity to mechanical mounts, and is particularly applicable for use in fabrication of optics for an extreme ultraviolet lithography (EUVL) imaging system that requires coated optics with angstrom level control of optical figure.

While a particular embodiment of the invention has been illustrated and described to exemplify and explain the principles of the invention, such is not intended to be limiting. Modifications and changes may become apparent to those skilled in the art, and it is intended that the invention be limited only by the scope of the appended claims.

What is claimed is:

1. An optical substrate that simultaneously provides high substrate dynamic stiffness, low surface figure sensitivity to mechanical mounting inputs, and constrains surface figure changes caused by optical coatings thereon to be primarily spherical in nature, said optical substrate comprising:

an optic section having a thickness with a variation of less than 10% extending from a center point to any point on a peripheral edge thereof, and having a substantially non-deformable optical surface to be coated;

a base section; and a connecting section substantially perpendicular to said optic and base sections and having a substantially constant cross section;

said optic section, said base section, and said connecting section forming a pedestal, and said optic section having a specified aspect ratio, and a substantially constant freeboard width about the peripheral edge.

2. The optical substrate of claim 1, wherein said optic, base and connecting sections are integral.

3. The optical substrate of claim 1, wherein said optic section has an optic section thickness$^2$/optic section diameter ratio of between about 5 to 10 mm.

4. The optical substrate of claim 1, wherein said optic section has a freeboard whose width is at least equal to that given by relationship ⅓x where x is optic section thickness$^2$/optic section diameter.

5. The optical substrate of claim 1, wherein said connecting section is hollow.

6. The optical substrate of claim 5, wherein said hollow connecting section includes a plurality of spaced legs adjacent the base section.

7. The optical substrate of claim 1, wherein said optic section has a substantially flat upper surface.

8. An optical substrate having a pedestal configuration, comprising:
   a disk-shaped optic section having a substantially constant thickness with a variation of not greater than 10% from a center point to a peripheral edge, a substantially non-deformable top surface adapted to contain a coating, and a specified aspect ratio and substantially constant freeboard width,
   a disk-shaped base section, and
   a connecting section substantially perpendicular to and fixedly attached between said base section and said optic section, said connecting section having a substantially constant cross section.

9. The optical substrate of claim 8, wherein said connecting section is selected from the group consisting of being integral with said optic section, being integral with said base section, being integral with said optic and base sections, and being formed separately and fixedly secured to said optic and base sections.

10. The optical substrate of claim 8, wherein said connecting section is constructed to be selected from the group consisting of solid, hollow, and hollow with a plurality of spaced legs located adjacent said base section.

11. The optical substrate of claim 8, wherein said connecting section, said optic section, and said base section are integral.

12. The optical substrate of claim 11, wherein said connecting section is hollow and includes three leg sections located adjacent said base section.

13. The optical substrate of claim 8, wherein said optic section is constructed to include an optic section thickness$^2$/optic section diameter ratio of between about 5–10 mm.

14. The optical substrate of claim 8, wherein the top surface of said optic section is constructed to contain a coating containing a clear aperture section and a freeboard section, wherein the freeboard section has a width at least equal to that given by the relationship ⅓x, where x is defined as the optic section thickness squared and divided by the optic section diameter.

15. The optical substrate of claim 14, wherein ⅓x is between about 5 to about 10 mm.

* * * * *